United States Patent [19]

Desilets et al.

[11] 4,384,938

[45] May 24, 1983

[54] REACTIVE ION ETCHING CHAMBER

[75] Inventors: Brian H. Desilets, Wappinger Falls; Thomas A. Gunther, Hopewell Junction, both of N.Y.; William C. Heybruck, deceased, late of Poughkeepsie, N.Y., by Dorothy G. Heybruck, executrix

[73] Assignee: International Business Machines Corporation, Armonk, N.Y.

[21] Appl. No.: 374,568

[22] Filed: May 3, 1982

[51] Int. Cl.$^3$ .................................................. C23C 15/00
[52] U.S. Cl. .................................... 204/298; 156/345; 156/643; 204/192 E
[58] Field of Search ............................ 204/298, 192 E; 156/643, 345

[56] References Cited

U.S. PATENT DOCUMENTS

| | | | |
|---|---|---|---|
| 3,730,873 | 5/1973 | Pompei et al. | 204/192 E |
| 4,209,357 | 6/1980 | Gorin et al. | 156/345 |
| 4,264,393 | 4/1981 | Gorin et al. | 156/643 |
| 4,297,162 | 10/1981 | Munot et al. | 204/298 |
| 4,340,461 | 7/1982 | Hendricks et al. | 204/298 |
| 4,352,974 | 10/1982 | Mizutani | 204/298 |

*Primary Examiner*—Arthur P. Demers
*Attorney, Agent, or Firm*—John A. Jordan

[57] ABSTRACT

A reactive ion etching chamber structure is designed to provide operation with uniformity in electric field and generated plasma so as to produce uniform, contaminant-free etching over large batches of silicon wafers. The anode chamber structure is cylindrical and physically symmetrical with respect to a round cathode plate with the internal surfaces of the chamber being free of any apertures, holes, recesses, or the like, having an opening dimension larger than one tenth the thickness of plasma "dark space". Under normal reactive ion etching conditions, such opening dimension is 1.5 mm or less and the distance between cathode and anode internal surface is 3.0 mm, or less.

15 Claims, 7 Drawing Figures

REACTIVE ION ETCHING CHAMBER

DESCRIPTION

BACKGROUND OF THE INVENTION

1. Field of the Invention

The present invention relates to improved etching chambers and, more particularly, to improved reactive ion etching chambers as employed in the fabrication of integrated circuits.

2. Description of the Problem and Prior Art

One of the difficulties encountered with prior art reactive ion etching (RIE) systems resides in the fact that, typically, they do not etch uniformly over the entire area of the target. The lack of uniformity and etch rate is caused, at least in part, by defects and deficiencies in the chamber design. The problem of lack of uniformity in system etching performance is compounded when larger and larger cathode targets are employed to increase throughput in etching semiconductor wafers. In this regard, it is evident that as larger target cathodes are employed, larger reaction chambers are required, and larger reaction chambers introduce a variety of conditions which affect etch rate uniformity within the chamber. However, it is known that commercially competitive systems must exhibit a high throughput characteristic, and high throughput necessitates the use of large batch etching.

The various prior art chamber and target cathode configurations have done little to alleviate the design defects which give rise to conditions which foster nonuniform etching within the chamber. For example, the so-called "top hat" cathode configuration operates to drive the cathode as the active electrode and utilizes a design which may result in lack of uniformity in the electric field above the cathode, particularly at its edges. Such a design is described in copending application Ser. No. 185,831 by Hendricks et al., filed Ser. 10, 1980, and assigned to the assignee of the present invention. Large area cathodes and chamber volumes, in general, tend to introduce non-uniformity in the electric field and, thus, the etching rate. In this regard, large chambers also generate excess plasma which acts to dissipate some of the energy introduced into the chamber, thus diluting the energy available for the etching process. In general terms, the lack of uniformity in the electric field is due not only to irregularities and discontinuities within the internal chamber surface area, but also due to the lack of a symmetrical characteristic to the chamber and cathode.

In addition to the lack of uniformity in etching, design characteristics may also introduce other problems. For example, sputtering and incident contamination may also result from faulty design characteristics. In this regard, the typical so-called "Tee" design, as commercially available in the market place, has a structural arrangement which permits plasma to be generated in the space below the electrode. The plasma below the cathode electrode excessively heats the electrode and causes a sputtering thereof of contaminants which find their way into the product being etched.

The various RIE tools heretofore known in the prior art all exhibit design defects which act to limit their ability to provide batch processing with a uniformity in etching in a contamination free environment. In accordance with the principles of the present invention, it has been found that improved RIE operations may be achieved by utilizing a chamber design which is cylindrical and physically symmetrical with respect to the cathode plate. In addition, all required apertures within the chamber are arranged to have opening dimensions less than the thickness of the "dark" space for the particular tool, whereby tool field uniformity is improved and points of field concentration are avoided. Thus, "hot spots" in the plasma leading to localized higher etch rates, as caused, for example, by the irregularities and discontinuities of windows, apertures, diagnostic ports and pumping ports are avoided by minimizing the size of the openings and the critical placement of same within the RIE chamber. Particularly good results are achieved by designing the cathode plate so as to extend to the chamber sidewalls with the isolation separation between sidewalls and plate being less than the thickness of the system "dark" space.

It is, therefore, an object of the present invention to provide an improved RIE system.

It is a further object of the present invention to provide an improved RIE chamber and cathode design.

It is yet a further object of the present invention to provide an RIE chamber which will permit batch processing of product.

It is yet still a further object of the present invention to provide an RIE system which will permit the batch processing of product with uniform etching.

It is yet still a further object of the present invention to provide an RIE chamber which will permit the batch processing of product with uniform etching in a contaminant free chamber.

The foregoing and other objects, features and advantages of the invention will be apparent from the following more particular description of the preferred embodiments of the invention, as illustrated in the accompanying drawings.

BRIEF DESCRIPTIONS OF THE DRAWINGS

DETAILED DESCRIPTION OF THE DRAWINGS

Figure 1A:
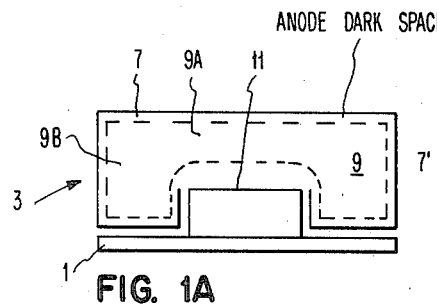
FIGS. 1A–1D show brief schematic representations of various prior art RIE cathode designs.

With reference to FIG. 1, there is shown, in brief schematic form, several RIE chamber and cathode configurations, as employed in the prior art. The purpose of FIGS. 1A–1B is to depict those design characteristics which cause nonuniformity in etching and contamination of the semiconductor product. FIG. 1A depicts a particular "top hat" cathode configuration. This configuration is similar to the "top hat" configuration described in the above cited copending application Ser. No. 185,831. As shown, cathode 1, in the shape of a top hat, fits in conventional fashion into chamber 3, which acts as anode. It is apparent, that much of the detail in FIG. 1 has been omitted for the sake of simplicity and as not being necessary to demonstrate the design features which causes the nonuniform etching characteristics of these devices. The dotted line traversing the interior surface of the chamber and cathode represents the division between a typical dark space, as shown by reference characters 7/7'/5, and the active plasma region, as shown by 9. As understood by those skilled in the art, operation of the RIE system in conventional manner causes a plasma glow to exist within the interior active plasma region 9 of chamber 3 with the glow region being separated from the interior chamber surfaces by a plasma sheath or "dark space".

To facilitate a clearer understanding of the operation of the RIE systems shown in FIG. 1A, the central plasma region situated over the pallet 11 of cathode 1 has been designated 9A while the outer plasma region situated between the pallet and chamber walls has been designated region 9B. As can be seen, plasma characteristics, such as for example the thickness of the plasma sheath or dark space, are determined by their particular location within the chamber. The cathode plasma sheath 5 above pallet 11 is the thickest sheath region (typically of the order of 1-2 cm), has a high potential drop thereacross (typically 300-500 Vdc) and is normally observed as a distinct dark space between the cathode and plasma glow. On the other hand, the anode plasma sheaths 7 at the top of the chamber and 7' along the sidewall are generally the same for cathode driven systems, typically exhibiting a thickness of 1-4 mm and a voltage drop of 20-30 V. As can be seen by the contour of the dotted lines, the various dark spaces merge continuously into each other throughout the internal surface. It is the regions where different thickness of dark space merge, as caused by sharp changes in potential and geometry, that cause variations in etch rates.

More particularly, as further seen with respect to FIG. 1A, the drop in plasma potential at the edges of the cathode pallet 11 creates a nonuniformity in the electric field above cathode, especially at the edges. The resultant gradient in the electric field gives rise to nonuniformity in the etch rate across the cathode, with the etch rate being greater toward the edges where the field exhibits a higher concentration.

Figure 1B:
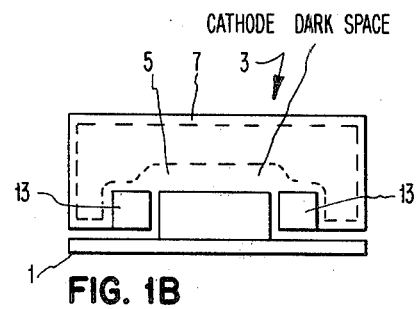

FIG. 1B depicts a further "top hat" cathode configuration wherein a ground shield 13 is employed around the periphery of cathode 1 in an effort to make more uniform the field and, therefore, etch rate. As can be seen, this causes the cathode sheath 5 to extend outwardly but still does not result in a satisfactorily uniform field and, thus, etch rate across the cathode pallet. Moreover, the ground shield arrangement takes up space and tends to restrict the size of the cathode, thus adversely impacting throughput.

Figure 1C:
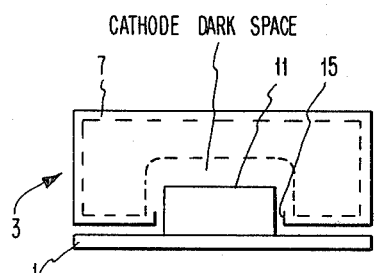

In the arrangement in FIG. 1C, section 15 of the chamber wall is reduced in height, as compared to FIGS. 1A and 1B, in an effort to provide an uniform field and, therefore, etch rate, across pallet 11. Although offering some improvement, this arrangement does not result in a satisfactorily uniform field and etch rate across the cathode pallet.

Figure 1D:
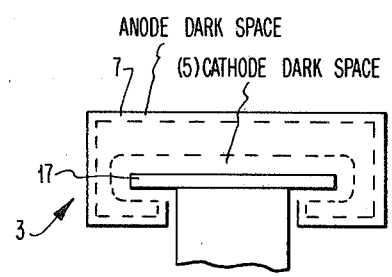

FIG. 1D depicts a cathode Tee configuration. As can be seen, this design permits the generation of plasma beneath pallet 17 with the potential of the dark space below being approximately the same as that above. Such arrangement acts to overheat the pallet and cause sputtering whereby contaminants are sputtered from the pallet and eventually find their way into the product being etched. One probable reason for this is that in this configuration, the full cathode potential is dropped across the dark space resulting in ion bombardment and heating of the cathode.

Figure 2:
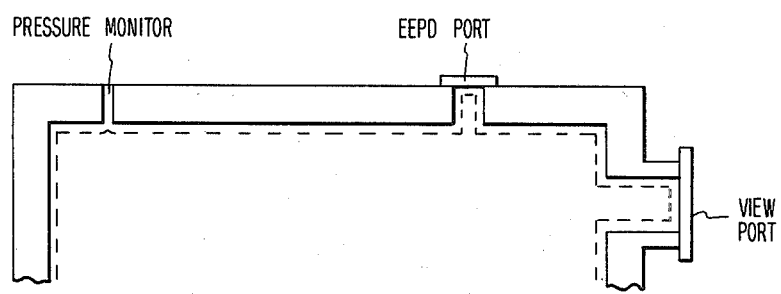
FIG. 2 shows a partial view of the typical prior art RIE chamber design without a cathode.

FIG. 2 depicts a partial view of a typical prior art RIE chamber wherein apertures for monitoring pressure, detecting end point and viewing are employed. Typically, this portion of the RIE chamber is above the cathode. As can be seen by the dashed line interior to the chamber, the dark space follows the internal surface of the chamber into the apertures creating variations in the electric field around the chamber periphery, particularly at points of sharp or marked change in the chamber wall. The points of sharp change in the chamber wall create regions of intense fields which appear as hot spots in the plasma causing localized higher etch rates, as compared to other parts of the chamber. Not only do sharp changes in the chamber wall create regions of intense fields resulting in field gradients which cause nonuniform etch rates, but where holes exist having opening dimensions greater than the thickness of the dark space, the hole will sustain plasma within its bounds further compounding the nonuniform etch rates.

It should also be appreciated that the design of the RIE systems shown in FIGS. 1A–1D results in an excess chamber volume in which plasma may be generated. This excess chamber volume exists within the chamber in the region adjacent to and below pallet 11. The excess chamber volume permits generation of excess plasma which dissipates some of the energy introduced into the chamber thus diluting the energy available for the etching process. It is understood that elimination of excess chamber volume will provide higher power density.

Figure 3:
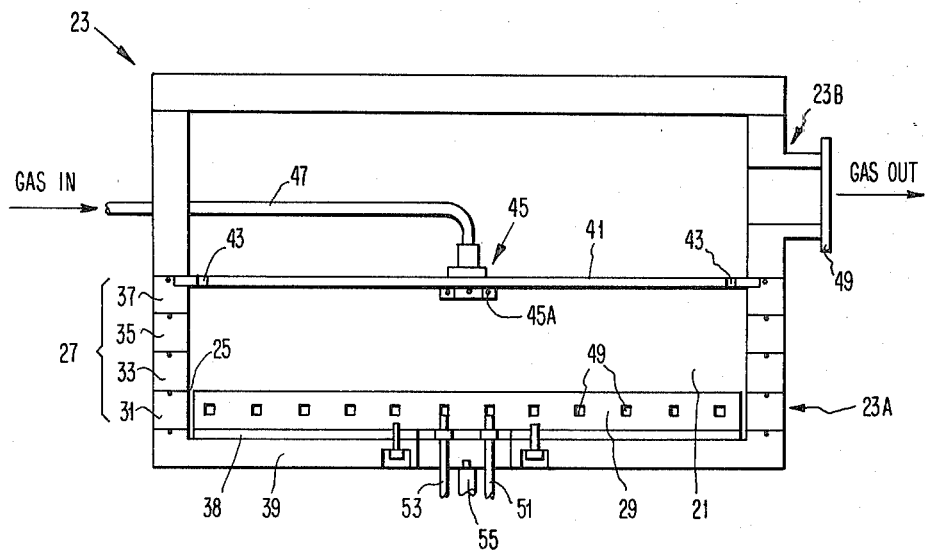
FIG. 3 shows one embodiment of an improved RIE chamber and cathode design, in accordance with the principles of the present invention.

FIG. 3 shows a topside pumping embodiment of the improved RIE chamber and cathode design, in accordance with the principles of the present invention. The chamber and cathode arrangement shown in FIG. 3 avoids the design errors described above. The basic principle of design is that the chamber 23, which acts as anode, and the cathode should be symmetrical and preferably cylindrical, and generally free of irregularities in the internal wall surfaces within the chamber. In addition, any windows, diagnostic ports, pumping ports and other openings of whatever nature required to be used are either positioned outside of the active plasma region or are designed to be such that their opening dimension is sufficiently smaller than the dark space thickness adjacent thereto so as to avoid the condition of an active plasma being sustained therein. In this regard, any hole or aperture required to communicate with the active plasma region through the chamber wall must have opening dimensions much less than the thickness of the dark space adjacent thereto in order to insure that active plasma will not be sustained therein. Typically, the hole or aperture opening is selected to be at least one tenth the thickness of the dark space. For example, where the dark space is of the order of 1.25 cm, the holes are selectd to be of the order of 1.5 mm, or less.

Thus, in the arrangement shown in FIG. 3, the active plasma region 21 is contained by plate 41 in an active chamber portion 23A, the internal surfaces of which have no holes, spaces, apertures, or the like with an opening dimension greater than one tenth the thickness of the dark space typically produced in normal operation of RIE systems. Any viewing ports, pump-out ports and the like are located in auxiliary chamber portion 23B above 23A. In this regard, plate 41 acts to confine active plasma generation to chamber portion 23A by using pump-out holes 43 sufficiently small so as to prohibit active plasma generation being sustained therein.

Conventional semiconductor RIE etching applications have a normal pressure regime of 30 to 70 microns which typically give a dark space thickness of 1 to 1½ cm. Thus, any anode opening dimension, in accordance with the present invention, should be 1.5 mm, or less. In addition, any separation or space between anode and cathode should be 3.0 mm, or less but not so close as to cause an electrical short. For example, the space 25 between anode chamber wall 27 and cathode 29 in FIG. 3 must be equal to or less than 3.0 mm. In addition, for normal operation pump-out holes 43 distributed about plate 41 (at anode potential) each have an opening dimension equal to or less than 1.5 mm. Although pump-out holes 43 may be arranged in plate 41 in any desired manner, positioning holes too close to one another results in their appearing as a single hole of sufficient size so as to sustain active plasma generation. To avoid this, it has been found that the holes must be maintained at least two hole diameters apart, i.e., 2D from one another where D is the diameter (1.5 mm or less) of the individual holes.

It can be seen from FIG. 3, that the chamber wall 27 is comprised of a series of rings including rings 31, 33, 35 and 37. These rings provide a convenient way of adjusting the chamber size as well as accessing the chamber and cathode for cleaning, maintanence and the like. In addition, it should be appreciated that one of the existing rings shown in FIG. 3 may readily be replaced by a diagnostic ring which includes, for example, diagnostic ports for mass spectrography, optical spectroscopy, Langmuir probing and electrical feedthrough. Such ring may be employed for trouble shooting or analysis purposes. It is clear, that after the diagnostic work is completed, the ring may be replaced by a ring free of any ports or apertures.

The rings used to form chamber wall 27 may be made of aluminum and may be coated on the inside surface with a nonmetallic material such as plastic or polymer. The nonmetallic coating acts to maintain the system in a passivated condition so that polymer deposition on the walls, or the cleaning of the system, will not change the chemical environment provided by the walls to the process. The non-metallic coating on the walls also acts as an electrical insulator to prevent shorts between the cathode 29 and ground. A relatively thick insulator layer 38 is also employed between cathode 29 and bottom wall 39.

Gas is introduced into the active plasma region 21 via gas nozzle 45. Any of the variety of gas nozzle arrangements may be employed for this purpose. However, it is necessary that the nozzle openings 45A be pointed toward the sidewalls of the chamber portion 23A. This is done to avoid a concentration of gas being distributed directly toward cathode 29 such that the electric field between cathode and anode will act upon this gas to cause a higher etch rate within the region of the gas concentration. In addition to being directed toward the walls of chamber portion 23A, the nozzle openings should be uniformly distributed in a symmetrical array. One way to implement such symmetrical array is to utilize a hexagonal nut at one end of a threaded tube with an orifice 15–20 mills, bored into each of the six surfaces of the nut to the interior of the tube. As shown to the left of RIE chamber 23, gas is admitted into the chamber via tube 47 passing through auxiliary chamber portion 23B. As shown to the right of chamber 23, gas is pumped out via port 49. It should be appreciated that, as is understood by those skilled in the art, a number of gases may be employed to carry out conventional RIE. One common gas employed for this purpose is carbon tetrafluoride ($CF_4$) and oxygen ($O_2$). Other gases that may be employed are $CHF_3$, $SF_6$ or $CClF_3$. As hereinabove stated, such gases operating within a normal pressure regime for RIE of 30–70 microns, give a dark space of 1 to 1½ cm.

To aid in cooling cathode 29, cooling channels 49 are provided with a cooling fluid admitted via port 51 and pumped out via port 53. RF power is applied to the cathode via connection 55.

The chamber arrangement shown in FIG. 3 has been used to batch etch up to 55 wafers with good uniformity 6% 3σ. Such batch etching was achieved on three inch wafers using $CF_4$ plasma at a pressure of 55 microns, a flow rate of approximately 55 SCCM, and an RF power of 1200 watts at an RF frequency of the order of 13.56 MHz.

Figure 4:
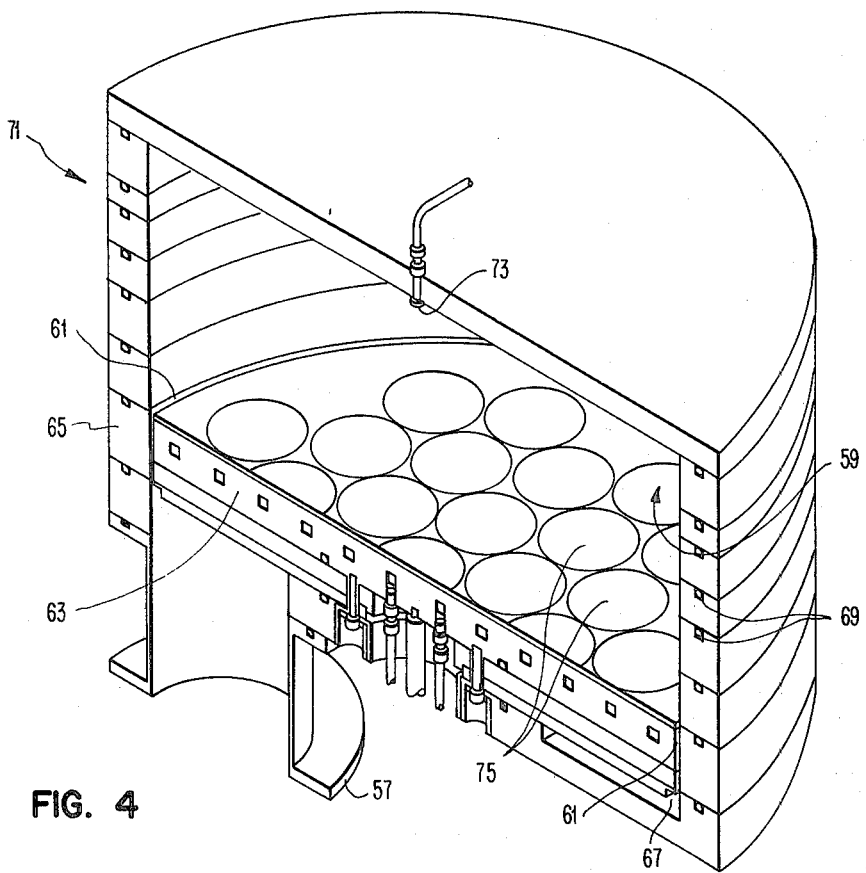
FIG. 4 shows a further embodiment of an improved RIE chamber and cathode design, in accordance with the present invention.

FIG. 4 shows a down-side pumping embodiment of the improved RIE chamber and cathode design, in accordance with the principles of the present invention. As can be seen, in the arrangement of FIG. 4 the auxiliary chamber portion 23B shown in FIG. 3 has been eliminated and the pumping port used in conjunction therewith positioned at the down-side of the cathode. Thus, as shown in FIG. 4, pump-out is achieved through pumping port 57 with the gas in chamber region 59 passing through channel 61 adjacent cathode 63 and ring 65 of the chamber wall. As hereinabove described with respect to FIG. 3, it is clear that the width dimension of opening 61 must be a fraction of the thickness dimension of the dark space, i.e., 3.0 mm or less for RIE systems operating in conventional manner but not so close as to short anode to cathode.

To permit gas to be uniformally pumped through opening 61 around the perimeter of cathode 63, a pumping ring 67 is provided. Pumping ring 67 provides a circular chamber beneath cathode 63 to permit collection of gas for pump-out.

In all other respects, the chamber arrangement in FIG. 4 is similar to the arrangement of FIG. 3. As can be seen, O-rings 69 are positioned between the respective chamber wall rings 71 forming the walls of the chamber. As shown, gas is introduced, via nozzle 73, into the chamber in the same manner as described with respect to FIG. 3. Wafers 75 are shown arrayed on cathode 63.

While the invention has been particularly shown and described with reference to the preferred embodiments thereof, it will be understood by those skilled in the art that various changes in form and details may be made therein without departing from the spirit and scope of the invention.

What is claimed is:

1. In a reactive ion etching tool having a reactive ion etching chamber acting as an anode and a plate arrangement acting as a cathode and wherein an RF signal applied between cathode and anode acts to produce an active glow region within said chamber with a dark space existing over the internal surfaces thereof, the improvement comprising a reactive ion etching chamber structure having an internal top surface and sidewall surfaces forming a physically symmetrical arrangement with respect to said cathode plate positioned between said sidewall surfaces below said top surface, said top surface and sidewall surfaces being uniform except for gas input and exhaust ports with said gas exhaust ports having an opening dimension less than the thickness of said dark space existing over said internal surface.

2. The reactive ion etching tool as set forth in claim 1 wherein said cathode plate positioned between said sidewall surfaces is positioned a distance from said sidewall surfaces less than the thickness of said dark space.

3. The reactive ion etching tool as set forth in claim 1 wherein the said opening dimension of said gas exhaust ports is 1.5 mm, or less.

4. The reactive ion etching tool as set forth in claim 2 wherein the said distance from said sidewall surface is 3.0 mm, or less.

5. The reactive ion etching tool as set forth in claim 4 wherein said chamber is round and at least a portion of said sidewall surfaces include stacked rings with at least one ring arranged to be removable and replaceable by a diagnostic ring.

6. The reactive ion etching tool as set forth in claim 4 wherein said sidewall surfaces are coated with a polymer insulating layer.

7. The reactive ion etching tool as set forth in claim 2 wherein said gas input ports include a manifold of ports emanating in symmetrical manner from a common source and oriented to direct gas toward said sidewall surfaces.

8. A reactive ion etching arrangement including an anode and a cathode designed to provide reactive ion etching operation in the presence of uniform plasma in a uniform electric field so as to produce relatively uniform, contaminant-free etching over large batches of silicon wafers, said arrangement comprising a cylindrical anode chamber structure physically symmetrical with respect to a round cathode plate structure with the internal surface of said anode chamber structure being free of any discontinuities having a dimension greater than a fraction of reactive ion etching dark space and with the distance between said round cathode structure and the said internal surface of said anode chamber structure immediately adjacent thereto being no greater than 3.0 mm.

9. The reactive ion etching arrangement as set forth in claim 8 wherein said fraction of reactive ion etching dark space is 1.5 mm or less.

10. In a reactive ion etching tool having a reactive ion etching chamber acting as anode and a plate arrangement acting as cathode, the improvement comprising an anode etching chamber cylindrical in shape and having an internal sidewall surface physically symmetrical about a round cathode plate with said anode etching chamber divided into an auxiliary chamber portion and an active plasma etching chamber portion by an anode plate member extending to the said sidewall surface of said etching chamber, said anode plate member having a plurality of holes therethrough to permit gas to be pumped from said active plasma etching chamber portion to said auxiliary chamber portion with the diameter of each hole of said plurality of holes being less than a fraction of the thickness of reactive ion etching dark space so that active plasma generation will not be sustained therein.

11. The reactive ion etching tool as set forth in claim 10 wherein said holes are separated from one another by a distance at least twice the diameter of the holes.

12. The reactive ion etching tool as set forth in claim 11 wherein each of said holes are 1.5 mm or less in diameter.

13. The reactive ion etching tool as set forth in claim 12 wherein said round cathode plate is separated from the point on said sidewall surface closest thereto by a distance of 3.0 mm or less.

14. The reactive ion etching tool as set forth in claim 13 wherein said sidewall surface is coated with a thin layer of polymer material.

15. The reactive ion etching tool as set forth in claim 14 wherein gas is admitted into said active plasma etching chamber portion by a symmetrical array of nozzles oriented to expend gas toward said sidewall.

* * * * *

UNITED STATES PATENT AND TRADEMARK OFFICE
CERTIFICATE OF CORRECTION

PATENT NO. : 4,384,938
DATED : May 24, 1983
INVENTOR(S) : Brian H. Desilets et al It is certified that error appears in the above—identified patent and that said. Letters Patent is hereby corrected as shown below:

Column 1, line 38     "Ser. 10" should be ---Sept. 10---;

Column 1, line 55     "so-called "Tee" design," should be ---so-called "Tee" cathode design,---.

Signed and Sealed this

Second Day of August 1983

[SEAL]

Attest:

GERALD J. MOSSINGHOFF

Attesting Officer    Commissioner of Patents and Trademarks